United States Patent [19]

Kinoshita

[11] Patent Number: 5,065,406
[45] Date of Patent: Nov. 12, 1991

[54] SEMICONDUCTOR LASER CHIP AND METHOD OF MAKING THE SAME

[75] Inventor: Junichi Kinoshita, Yokohama, Japan
[73] Assignee: Kabushiki Kaisha Toshiba, Kawasaki, Japan
[21] Appl. No.: 670,271
[22] Filed: Mar. 15, 1991

[30] Foreign Application Priority Data

Mar. 16, 1990 [JP] Japan ................................ 2-66685

[51] Int. Cl.⁵ ........................... H01S 3/08; H01S 3/19
[52] U.S. Cl. ...................................... 372/96; 372/23; 372/50; 372/97
[58] Field of Search .................. 372/96, 97, 50, 23, 372/46; 437/129

[56] References Cited

U.S. PATENT DOCUMENTS 4,985,897  1/1991  Butez et al. .......................... 372/97
4,993,036  2/1991  Ikeda et al. .......................... 372/96

Primary Examiner—Georgia Epps
Attorney, Agent, or Firm—Finnegan, Henderson, Farabow, Garrett and Dunner

[57] ABSTRACT

A semiconductor laser chip comprises a semiconductor substrate, two laser stripes formed on the semiconductor substrate and each having a light waveguide path and a diffraction grating extending along the light waveguide path, and a groove for electrically isolating the laser stripes from each other. The facet phases of the diffraction grating at those facets of the plural laser stripes which are located at least in the same direction are different from each other. The diffraction gratings at the facets of two laser stripes comprise a plurality of grooves extending at an acute angle relative to the facets.

8 Claims, 3 Drawing Sheets

SEMICONDUCTOR LASER CHIP AND METHOD OF MAKING THE SAME

BACKGROUND OF THE INVENTION

1. Field of the Invention

The present invention relates to a semiconductor laser chip having a diffraction grating along a laser stripe which includes a light waveguide path, and it also relates to a method of making the semiconductor laser chips.

2. Description of the Related Art

Various kinds of semiconductor light emitting elements have been widely used these days as light sources for optical communications and disks.

A distributed feedback laser (DFB laser) having a periodic perturbation (or diffraction grating) along a light waveguide path enables oscillation to be made at a single wavelength (or under single longitudinal mode) because the wavelength of the diffraction grating can be selected. Laser created using materials of the GaInAsP-/InP group has been most widely used among others as the light source for long-distance high-speed optical communications.

In the case of the DFB laser. the single longitudinal mode oscillation can be generally realized, depending upon the phase of the diffraction grating at the facet of the laser stripe.

However, the present is that the period of the diffraction grating is about 2000 and that the facets of the laser stripe are cleaved facets, and it is therefore impossible in fact to accurately control the phases of the diffraction grating at the facets of the laser stripe. Although depending upon structure parameters, the productivity of laser chips which enable the single longitudinal mode oscillation to be made is thus kept lower than 50% or usually quite low ranging from 20% to 30%.

Recently, attention is paid to a such structure that reflectivity is reduced at both cleaved facets of the laser stripe and a discontinuous section (shifted only by such a phase as corresponds to a quarter of the guide wavelength $\lambda$) at the period of the diffraction grating is formed in the center of the resonator. The element of this $\lambda/4$ shift structure is quite advantageous for single longitudinal mode operation because the gain difference of longitudinal mode (between the lowest and second modes) is large. However, this element has a problem. Namely, the process of making the shift structure becomes extremely complicated. For example, the method of conducting the two-beam interferometric exposure while combining the positive resist with the negative one (Uko, et al: Lecture prepared for the Applied Physics Meeting, Spring, 1985: Lecture No. 29p - ZB - 15), the method of conducting the two-beam interferometric exposure while using a phase mask (Shirosaki, et al: Electronic Intelligence Communication Meeting, Semiconductor Materials Section, Autumn, 1985: Lecture No. 311: Shirosaki, et al: Electronic Intelligence Communication Meeting, Report on Studies of Light Quantum Electronics, 1985, OQE85 - 60), or the like must be employed.

In a case where normalized coupling coefficient kL is larger than 1.25, radiation mode light concentrates on the position shifted by the phase of $\lambda/4$. This large bias in the light density distribution of waveguide mode causes spatial hall-burning in the axial direction of the resonator (Soda, et al: Electronic Intelligence Meeting, Section on Studies of Light Quantum Electronics, OQE 87 - 7, pp.49–56, 1986). The gain difference $\Delta a$ between longitudinal modes which was a large value is thus made small. In short, the capability of single longitudinal mode is greatly damaged. This causes the productivity of laser chips to be made lower. As described above, it was quite difficult to produce the DFB laser chips, which can oscillate under single longitudinal mode, with high productivity.

SUMMARY OF THE INVENTION

The object of the present invention is to provide a semiconductor laser chip having a diffraction grating along a laser stripe in which a light waveguide path is included and capable of oscillating under single longitudinal mode and also to provide a method of making the semiconductor laser chips.

The present invention eliminates the above-mentioned drawbacks according to the following manner.

According to the present invention, the DFB laser chips each having a diffraction grating are used, for example, and plural laser stripes are formed in this laser chip in such a way that they can be electrically isolated from each other. The phase of the diffraction grating is changed at each of facets of the plural laser stripes.

When difference between the phases of the diffraction grating at the facets of the plural laser stripes is represented by $\Delta\theta$, a limitation is added to this difference $\Delta\theta$ in such a way that one of the plural laser stripes can has the highest probability of oscillating under single longitudinal mode.

According to the method of making the semiconductor laser chips, the diffraction grating is formed while being shifted by a predetermined angle $\phi$ from the cleaved facet which will cross the laser stripe.

In the case of the semiconductor laser chip as described above, plural laser stripes are formed and one of these laser stripes which is the best in characteristics is selected and used. The probability of oscillating under single longitudinal mode can be thus made higher.

In the case of the DFB laser chips, the probability of oscillating under single longitudinal mode in one of them cannot be necessarily enhanced even if a plurality of them are arranged side by side in a simple manner.

When the phase of the diffraction grating is changed at the facet of each of plural laser stripes, however, the probability of oscillating under single longitudinal mode in one of these laser stripes can be enhanced.

In addition, this probability can be made higher and higher as the number of the laser stripes formed is made more and more.

Further, when the diffraction grating is formed while being shifted by the predetermined angle $\phi$ from those cleaved facets which will cross the laser stripes. the phase of the diffraction grating can be more easily changed at the facet of each of the plural laser stripes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

A case where the present invention is applied to the DFB laser of the buried type of GaInAsP/InP group will be described in detail with reference to the accompanying drawings.

Figure 1:
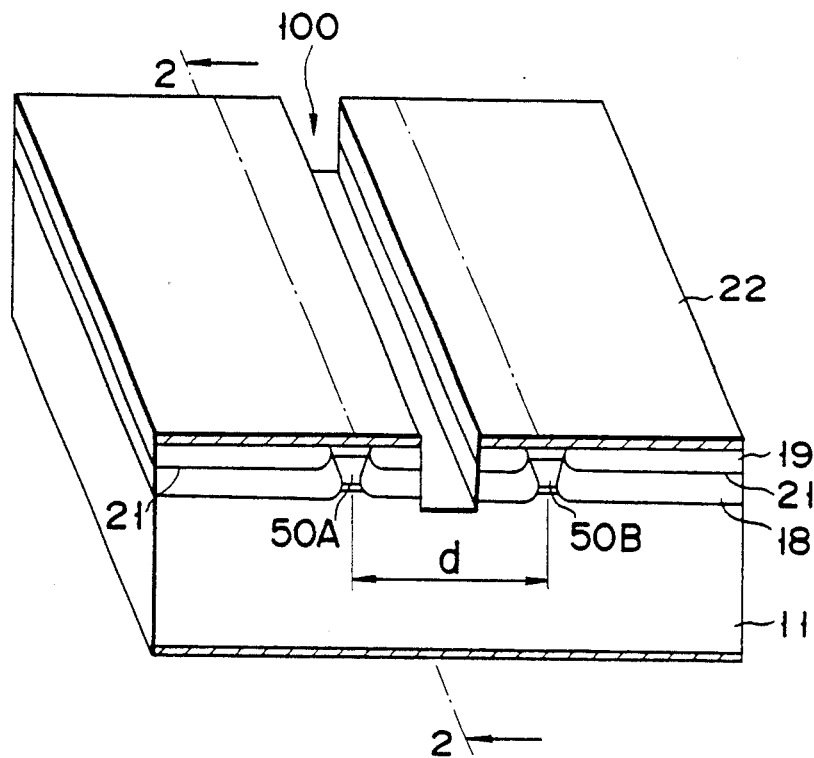
FIG. 1 is a perspective view showing a DFB laser chip according to one embodiment of the present invention.
Figure 2:
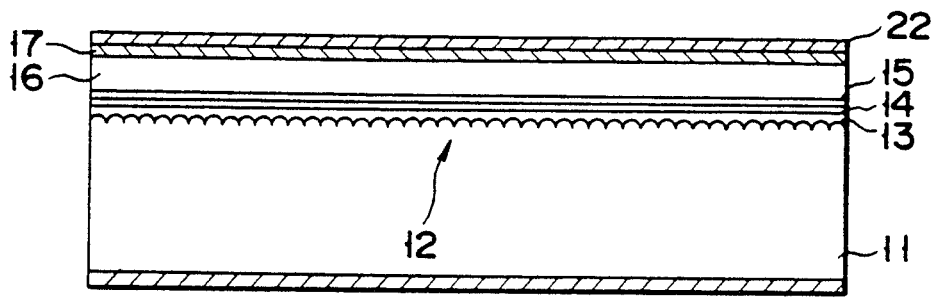
FIG. 2 is a sectional view taken along a line 2—2 in FIG. 1.
Figure 3:
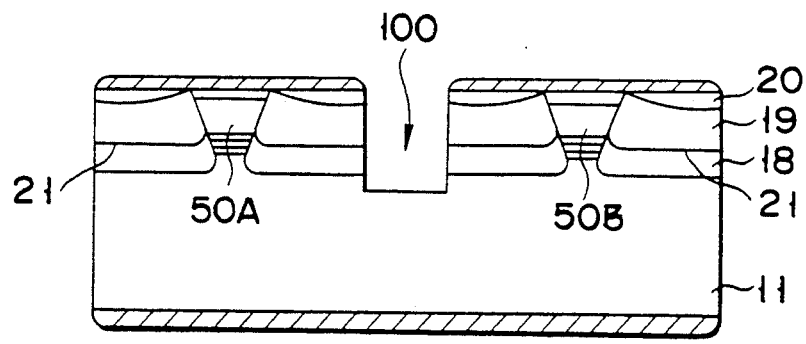
FIG. 3 is a front view showing the DFB laser chip.

FIG. 1 is a perspective view showing one embodiment of the DFB laser chip according to the present invention, FIG. 2 a sectional view taken along a line 2—2 in FIG. 1, and FIG. 3 a front view showing the laser chip. This laser chip is made as follows.

A primary diffraction grating 12 is formed on the top of an n-type InP substrate (or semiconductor wafer) 11 according to the two-beam interferometric exposing manner and an n-type GaInAsP light waveguide layer ($\lambda = 1.3$ μm stripe composition) 13, an undope GaInAsP active layer ($\lambda = 1.55$ μm stripe composition) 14, a p-type GaInAsP anti-meltback layer ($\lambda = 1.3$ μm stripe composition) 15, a p-type InP clad layer 16, and a p$^+$-type GaInAsP ohmic contact layer ($\mu = 1.15$ μm stripe composition) 17 are successively deposited in this order on the primary diffraction grating 12 by the CVD method. Two mesa stripe sections ($\approx$ laser stripes) 50A and 50B extending parallel to each other are then formed by selectively etching the deposited multi-layer. This etching is conducted downward from the deposited section located between and outside the stripe sections, that is, from the contact layer 17 to the diffraction grating 12 in such a way that the stripe sections are separated from each other by a distance d and that they are located on the substrate 11.

A p-type InP layer 18, an n-type InP layer 19 and undope GaInAsP cap layer ($\lambda = 1.15$ μm stripe composition) 20 are then successively developed and buried on both sides of each of the stripe sections 50A and 50B on the substrate 11, that is, at those areas on the substrate 11 from which the deposited section has been removed (BH structure). As the result, p-n reverse bias junctions 21 are formed at the buried areas to block current. Current can be thus injected only into the stripe-like active layer 14 with high efficiency.

An alloy electrode 22 is then formed on all over the stripe sections 50A and 50B and the buried areas. The buried area between the stripe sections 50A and 50B is downward etched in a stripe from the electrode 22 to the surface of the substrate to form a separation groove 100. The wafer is then separated along the cleaved facet and a laser chip can be thus obtained. In the case of this laser chip thus obtained, the two laser stripes 50A and 50B are electrically isolated from each other by the separation groove 100 and their facets are formed by the cleaved facet.

One of the laser stripes 50A and 50B which is better in characteristics is used as a practical laser emitter in the case of this laser chip.

Figure 4:
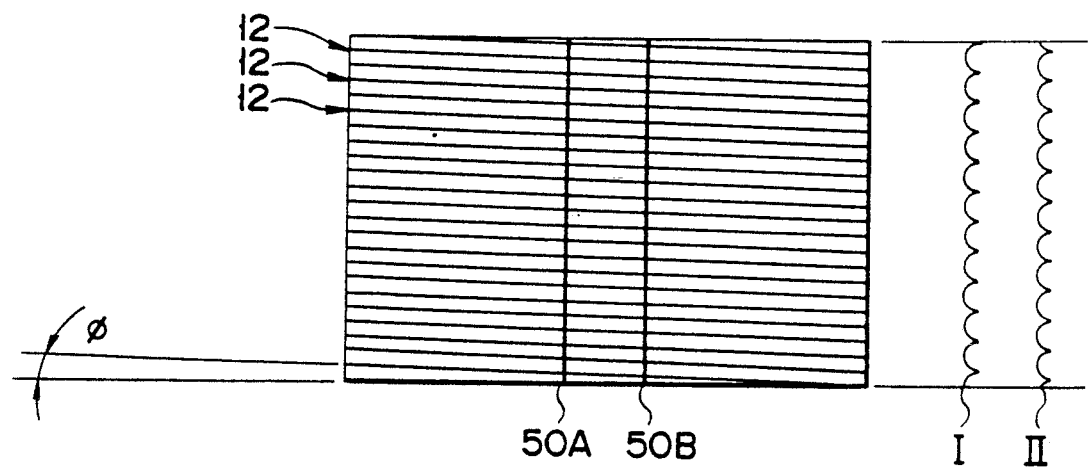
FIG. 4 is a plan view showing the relationship among a direction in which a diffraction grating is formed, a cleaved facet and laser stripes.

As seen in the plan view in FIG. 4 which shows the relationship among the diffraction grating, the cleaved facet and the laser stripes, a plurality of parallel linear grooves which form the diffraction grating 12 are formed in the case of this laser chip in such a way that the direction in which these grooves extend is not parallel but acute to the cleaved facet, that is, it is shifted from the cleavage plane only by an angle $\phi$.

Providing that the interval between the two laser stripes is d, that the facet phase difference at which the probability of oscillating under single longitudinal mode can be enhanced is $\Delta\theta$, and that the cycle of the diffraction grating is $\Lambda$, the direction in which the grooves of the diffraction grating are formed, and the angle $\phi$ by which this direction is shifted from the cleavage plane can be calculated as follows:

$$\phi = \tan^{-1}(\Lambda \cdot \Delta\theta / 2\pi d) \tag{1}$$

This angle $\phi$ may be controlled by shifting the interference plane from the cleaved facet only by the angle $\phi$ when the diffraction grating is exposed on the substrate by the two-beam interferometric exposing manner. This control could be made easy using a precise rotary stand and shooting laser beam onto the cleavage plane to view how the beam reflected was shifted.

A line I in FIG. 4 represents a section of the diffraction grating of the laser stripe 50A and a line II another section of the diffraction grating of the laser stripe 50B. As apparent from the lines I and II, phases of the diffraction grating at facets of the laser stripes 50A and 50B are shifted from each other. This phase shift is determined by both of the angle $\phi$ and the distance d.

The optimum facet phase difference $\Delta\theta$ of the two laser stripes 50A and 50B formed in the same chip was obtained as follows:

In order to oscillate under single longitudinal mode, it is at least needed that the gain difference between threshold values of two following modes is large and that the above-mentioned spatial hall-burning in the axial direction is small. In order to make the hall burning small, it is needed that light density distribution is flat in the axial direction of the resonator. In short, it is essential that the gain difference $\Delta\alpha L$ (L: length of the resonator) between standardized threshold values is large and that the rate F of the smallest and the largest value of the light density distributions in the axial direction is large. Therefore, the facet phase of one laser stripe is changed at random (in kinds of 16×16, for example) and the phase of the diffraction grating at the facet of the other laser stripe is shifted only by $\Delta\theta$ from each combination of these facet phases changed. The probability which enabled at least one of the two laser stripes to meet the above-mentioned requisites of F and $\Delta\alpha L$, that is, the oscillation to be made under single longitudinal mode was calculated.

This probability calculation was conducted while changing the facet phase difference $\Delta\theta$ to determine a range of $\Delta\theta$ which enabled the productivity to be enhanced to a greater extent as compared with the case where $\Delta\theta = 0$ (single laser stripe).

Figure 5A:
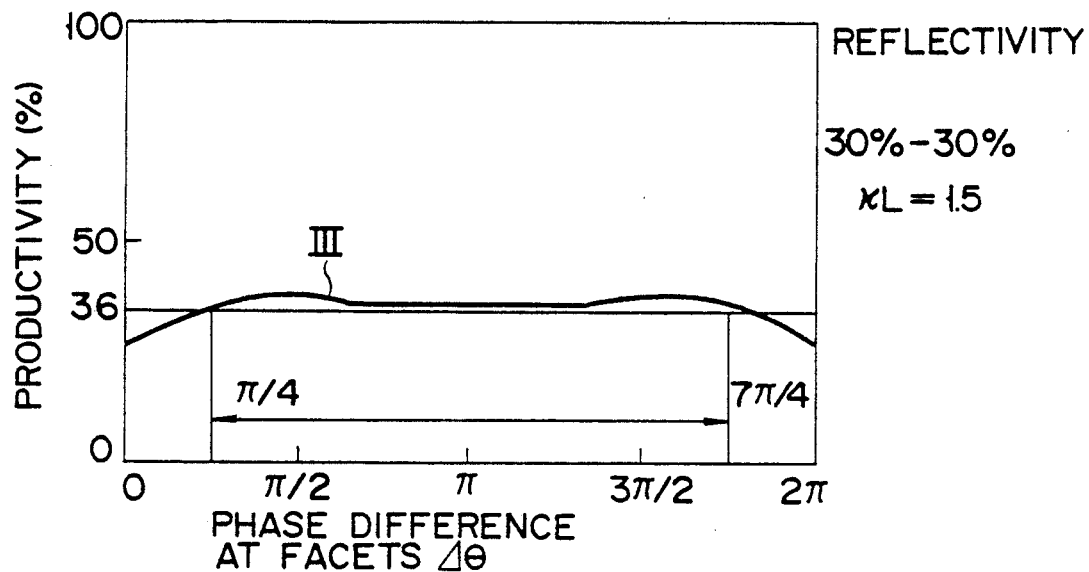
FIGS. 5A and 5B are views for showing relationships between facet phase differences $\Delta\theta$ and productivities in those cases where reflectivities are different from each other at the facets of laser stripes.
Figure 5B:
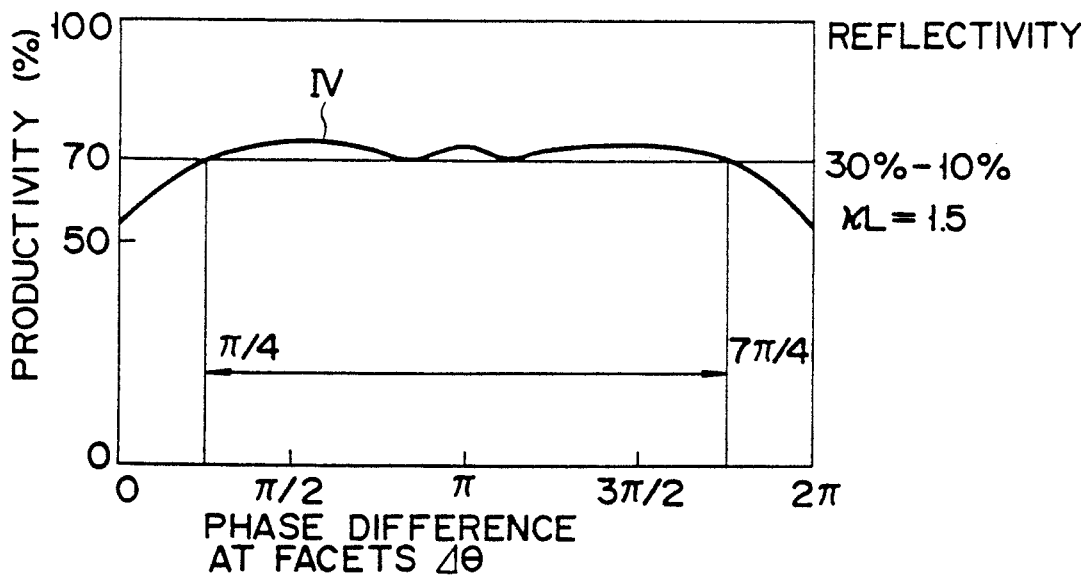

FIGS. 5A and 5B show results of this calculation.

In a case where normalized coupling coefficient kL (a structure parameter representing the amount of light feedback caused by the diffraction grating) was 1.5 and reflectivity was 30% at both of the facets (cleared facets), as shown in FIG. 5A, a productivity higher than 36% (28% in the case of single laser stripe) was achieved, as shown by a curve III in FIG. 5A, in a range as defined as follows:

$$\{(\tfrac{1}{4})\cdot\pi\} \leq \Delta\theta \leq \{(7/4)\cdot\pi\} \qquad (2)$$

Even in a case where normalized coupling coefficient kL was 1.5, reflection factor was 30% at one facet (cleaved facet) and reflectivity was made 10% at the other facet by applying dielectric coating to it, as shown in FIG. 5B, a productivity higher than 70% (54% in the case of single laser stripe) was achieved, as shown by a curve IV in FIG. 5B, in the range of facet phase difference $\Delta\theta$ expressed by the equation (2).

The rate F of the smallest and the largest value of the light density distributions in the axial direction and the gain difference $\Delta\alpha L$ of standardized threshold values were set in the above cases as follows:

$$F \geq 0.4$$

$$\Delta\alpha L = 0.1$$

Even in a case where the normalized coupling coefficient kL and the facet reflectivity have values other than those mentioned in the above cases, the productivity is similarly enhanced to a greater extent in the range of facet phase difference $\Delta\theta$ expressed by the equation (2), as compared with the case a single laser stripe is used.

Further, this trend was kept unchanged even when F and $\Delta\alpha L$ were changed to some extent.

Test results practically obtained also show that the productivity is enhanced to a greater extent when the facet phase difference $\Delta\theta$ is set in the range expressed by the equation (2).

Although two laser stripes have been formed in a laser chip in this embodiment of the present invention, considering the easiness of wire bonding (or size of the bonding pad), the probability which enables the DFB laser to oscillate under single longitudinal mode can be made higher and the productivity of chips per wafer can be enhanced to a greater extent in a case where three or more laser stripes are formed in a same chip.

Although the DFB laser chip of the buried type has been described in the case of this embodiment, the present invention is not limited to the DFB laser chip of the buried type but it can be applied to any of the semiconductor laser chips provided with the diffraction grating without losing any of the above-mentioned merits. The present invention can be applied, without departing from its spirit and scope, to those semiconductor lasers whose laser stripes are formed by current pinch (gain waveguide structure), for example.

Needless to say, the present invention can be applied to the distributed beam reflection laser (or DBR laser) as well as the DFB laser, both of these lasers serving as the semiconductor laser chips each provided with the diffraction grating.

The phase may be not necessarily made different at one and the other facets of plural laser stripes but it may be made different at one facets of them along the diffraction grating. In a case where the diffraction grating does not extend along the whole length of the light waveguide path, that is, it does not extend from one end to the other end of the light waveguide path but it ends before it reaches the other end thereof, for example, the phase may be made different at one facets of the plural laser stripes.

According to the present invention as described above, a chip capable of oscillating under single longitudinal mode at a higher probability can be provided particularly as the semiconductor laser chip provided with the diffraction grating. In addition, a chip making method capable of enhancing the productivity of the chips per wafer to a greater extent can also be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor laser chip comprising:
   a semiconductor substrate;
   at least two laser stripes formed on the semiconductor substrate and each having a light waveguide path and a diffraction grating extending along the light waveguide path;
   means for electrically isolating the laser stripes from each other; and
   the facet phases of the diffraction grating at those facets of the plural laser stripes which are located at least in the same direction being different from each other.

2. The semiconductor laser chip according to claim 1, wherein when the difference of the phases of the diffraction grating at the facets of the plural laser stripes is represented by $\Delta\theta$, it is in a range defined by $(2n+\tfrac{1}{4})\pi \leq \Delta\theta \leq (2n+7/4)\pi$, wherein n represents zero or one of integers.

3. The semiconductor laser chip according to claim 1, wherein the diffraction gratings at the facets of two laser stripes comprise a plurality of grooves extending at an acute angle relative to the facets.

4. The semiconductor laser chip according to claim 3, wherein both grooves of the diffraction gratings which correspond to each other at the facets of the laser stripes extend along a straight line.

5. The semiconductor laser chip according to claim 3, wherein the facets of two laser stripes are cleaved facets.

6. A semiconductor laser chip comprising:
   a substrate; and
   at least two semiconductor laser stripes formed on the substrate, extended parallel to each other with a predetermined interval interposed between them, and electrically isolated from each other, said laser stripes each including a light waveguide path extending from one ends to the other end thereof, a diffraction grating provided with a plurality of grooves extending parallel to one another and arranged along the light waveguide path, and cleaved facets located at both ends of the diffraction grating, said grooves of the diffraction gratings being acutely tilted relative to the cleavage planes.

7. The semiconductor laser chip according to claim 6, further comprising semiconductor buried areas formed outside each of the laser stripes and between them and provided with reverse p-n junctions; and a groove formed at the semiconductor buried area between the adjacent laser stripes to electrically insulate these laser stripes from each other.

8. A method of manufacturing a semiconductor laser chip having diffraction gratings along laser stripes which have a light waveguide path, comprising:

forming a diffraction grating on a semiconductor substrate in such a way that it is shifted by a predetermined angle $\phi$ from cleaved facets which will cross the laser stripes;

forming a semiconductor layer on the diffraction grating;

forming the plural laser stripes in the semiconductor layer;

selectively forming an area for electrically isolating predetermined adjacent ones of the plural laser stripes from each other; and cleaving a laser chip in which the isolating area and the plural laser stripes isolated from each other by the isolating area are included.

* * * * *